United States Patent
Lee et al.

(10) Patent No.: US 11,787,690 B1
(45) Date of Patent: Oct. 17, 2023

(54) MEMS ASSEMBLY SUBSTRATES INCLUDING A BOND LAYER

(71) Applicant: Knowles Electronics, LLC, Itasca, IL (US)

(72) Inventors: Sung Bok Lee, Chicago, IL (US); John Szczech, Schaumburg, IL (US); Josh Watson, Aurora, IL (US)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 377 days.

(21) Appl. No.: 17/221,479

(22) Filed: Apr. 2, 2021

Related U.S. Application Data

(60) Provisional application No. 63/005,162, filed on Apr. 3, 2020.

(51) Int. Cl.
| | | |
|---|---|---|
| *B81B 7/00* | (2006.01) | |
| *B81C 1/00* | (2006.01) | |
| *H04R 19/04* | (2006.01) | |
| *H04R 31/00* | (2006.01) | |

(52) U.S. Cl.
CPC ........ *B81C 1/00325* (2013.01); *B81B 7/0048* (2013.01); *H04R 19/04* (2013.01); *H04R 31/006* (2013.01); *B81B 2201/0257* (2013.01); *B81B 2207/012* (2013.01); *B81C 2203/0792* (2013.01); *H04R 2201/003* (2013.01)

(58) Field of Classification Search
CPC ........ B81C 1/00325; B81C 2203/0792; B81B 7/0048; B81B 2207/012; H04R 19/04; H04R 31/006; H04R 2201/003
See application file for complete search history.

(56) References Cited

U.S. PATENT DOCUMENTS

| | | |
|---|---|---|
| 7,190,038 B2 | 3/2007 | Dehe et al. |
| 7,202,552 B2 | 4/2007 | Zhe et al. |
| 7,436,054 B2 | 10/2008 | Zhe |
| 7,473,572 B2 | 1/2009 | Dehe et al. |
| 7,709,292 B2 | 5/2010 | Sadwick et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,300,857 B2 | 10/2012 | Omura et al. |
| 8,433,084 B2 | 4/2013 | Conti et al. |
| 8,796,866 B2 | 8/2014 | Wang |
| 8,877,077 B2 | 11/2014 | Lichtensteiger |

(Continued)

FOREIGN PATENT DOCUMENTS

| | | |
|---|---|---|
| WO | WO-2019/096998 | 5/2019 |
| WO | WO-2020/230358 | 11/2020 |

*Primary Examiner* — Samuel A Gebremariam
(74) *Attorney, Agent, or Firm* — FOLEY & LARDNER LLP

(57) ABSTRACT

A method of forming a micro electro mechanical system (MEMS) assembly comprises providing a substrate having an electrically conductive layer disposed thereon. The method also comprises depositing, on the substrate over the electrically conductive layer, a bonding material having an elastic modulus of less than 500 MPa so as to form a bond layer. The bond layer is completely cured, and a MEMS die is attached to the completely cured bond layer.

20 Claims, 10 Drawing Sheets

Operation 6

(56) References Cited

U.S. PATENT DOCUMENTS

| | | | |
|---|---|---|---|
| 10,536,779 | B2 | 1/2020 | Kitamura et al. |
| 10,820,083 | B2 | 10/2020 | Szczech et al. |
| 10,903,156 | B2 | 1/2021 | Pahl |
| 2005/0207605 | A1 | 9/2005 | Dehe et al. |
| 2007/0278501 | A1 | 12/2007 | Macpherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 | 2/2010 | Song |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0216282 | A1 | 8/2010 | Wang et al. |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0075875 | A1 | 3/2011 | Wu et al. |
| 2012/0313190 | A1* | 12/2012 | Goel ................ H01L 24/32 |
| | | | 257/782 |
| 2018/0111826 | A1 | 4/2018 | Durston et al. |
| 2021/0028766 | A1 | 1/2021 | Hurwitz et al. |

\* cited by examiner

Operation 5

Operation 6A

Operation 6B

Operation 6

Operation 7 ized to a substrate of a MEMS assembly.

MEMS ASSEMBLY SUBSTRATES INCLUDING A BOND LAYER

CROSS-REFERENCE TO RELATED APPLICATIONS

The present application claims priority to and benefit of U.S. Provisional Application No. 63/005,162, filed Apr. 3, 2020, the entire disclosure of which is hereby incorporated by reference herein.

TECHNICAL FIELD

The present disclosure relates generally to systems and methods for providing a substrate including a bond layer, or mounting pads formed from a bond material disposed on the substrate of a MEMS assembly.

BACKGROUND

MEMS assemblies are used in electronic devices for performing various functions. For example, microphone assemblies are used in electronic devices to convert acoustic energy to electrical signals. Advancements in micro and nanofabrication technologies have led to the development of progressively smaller micro-electro-mechanical-system (MEMS) microphone assemblies. MEMS microphone assemblies include acoustic transducers and integrated circuits that are generally disposed on a solder resist layer of a printed circuit board, and bonded to the solder resist layer using a thin layer of die attach adhesive. The hardness of the PCB material and the solder resist layer transmits stress to the acoustic transducer and the integrated circuit during the bonding process that can damage or change the mechanical behavior of these components.

SUMMARY

In some embodiments, a method of forming a micro electro mechanical system (MEMS) assembly comprises: providing a substrate having an electrically conductive layer disposed thereon; depositing, on the substrate over the electrically conductive layer, a bonding material having an elastic modulus of less than 500 MPa so as to form a bond layer; completely curing the bond layer; and attaching a MEMS die to the completely cured bond layer.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1A:
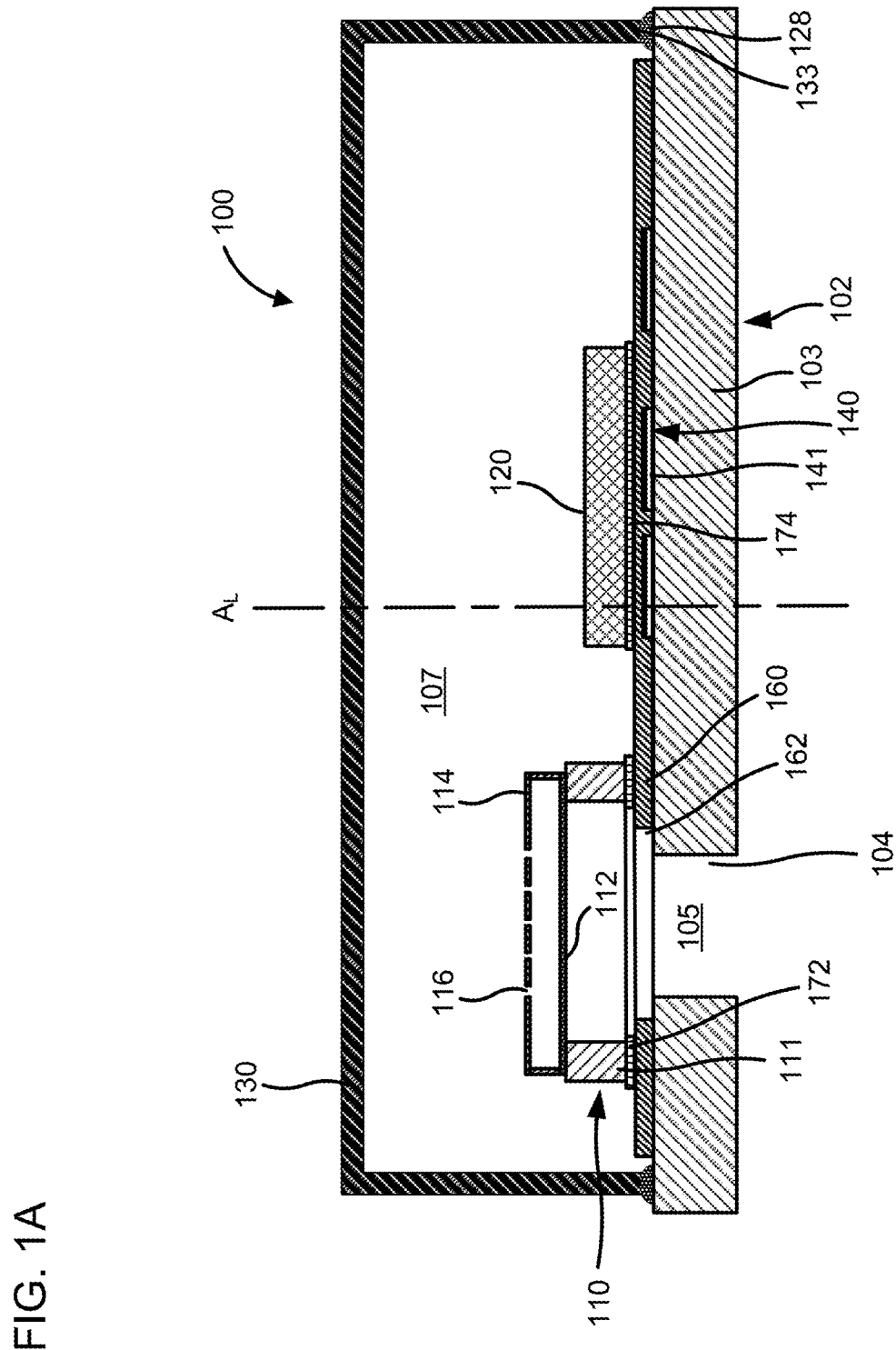
FIG. 1A is a side cross-section view of a MEMS assembly, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Embodiments described herein relate generally to MEMS assemblies that include a bond layer or mounting pads formed from a bond material disposed on a substrate of the MEMS assembly. The bond layer or the mounting pads provide a cushioning layer for a MEMS die or integrated circuit being disposed on the substrate that significantly reduces stress transfer to the MEMS die or integrated circuit and thereby, reduces or prevents damage to these components during the bonding process.

MEMS assemblies have enabled reduction in size of various electronic devices. For example, small MEMS microphone assemblies have allowed incorporation of such microphone assemblies in compact devices such as cell phones, laptops, wearables, TV/set-top box remotes, etc. The MEMS microphone industry faces continuous demand to reduce footprint, package volume, power consumption and cost while increasing performance and reliability. MEMS microphone assemblies include acoustic transducers and integrated circuits that are generally disposed on a solder resist layer of a printed circuit board and bonded to the solder resist layer using a thin layer of die attach adhesive. The hardness of the PCB material and the solder resist layer transmits stress to the acoustic transducer and the integrated circuit during the bonding process, which can damage or change the mechanical behavior of these components such as sensitivity.

In contrast, embodiments of the MEMS assemblies, particularly microphone assemblies, described herein may provide one or more benefits including, for example: (1) providing a bond layer or mounting pads formed from a bonding material having an elastic modulus of less than 500 MPa disposed on a substrate, or a solder resist layer disposed on the substrate of the MEMS assembly, which provide a cushioning layer for bonding a MEMS die and/or an integrated circuit to the substrate; (2) providing bonding of the MEMS die and the integrated circuit directly to the bond layer or mounting pad through direct bonding or via an adhesive; and (3) reducing stress transfer to the MEMS die and the integrated circuit, thereby reducing damage to these components and increasing yield of MEMS assemblies.

While various embodiments described herein are described with respect to a MEMS dies that include microphone assemblies, it should be appreciated that any of the concepts described herein are equally applicable to any MEMS assembly including any MEMS die or component.

FIG. 1A is a side cross-section view of a MEMS assembly 100 that comprises, according to a particular embodiment. In some embodiments, the MEMS assembly 100 may include a microphone assembly that may be used for converting acoustic signals into electrical signals in any device such as, for example, cell phones, laptops, TV/set top box remotes, tablets, audio systems, head phones, wearables, portable speakers, car sound systems or any other device which uses a microphone assembly.

The MEMS assembly 100 comprises a housing 102 including a substrate or base 103, a MEMS die 110 (e.g., an acoustic transducer, a pressure sensor, an accelerometer, or any other MEMS die), an integrated circuit 120, and an enclosure or cover 130. The substrate 103 can be formed from materials used in printed circuit board (PCB) fabrication (e.g., plastics, a thermoset plastic such as FR4, or polymers). For example, the substrate 103 may include a PCB configured to mount the MEMS die 110, the integrated circuit 120 and the enclosure 130 thereon. The substrate 103 is formed from a material that is relatively hard and has a high elastic modulus, for example, greater than 3,000 MPa. A sound port 104 is formed through the substrate 103. In some embodiments, the substrate 103 includes a surface-device interface including electrical contacts 141 formed by an electrically conductive layer 141 disposed on the substrate that are coupled to the integrated circuit 120, for example, to connection pads (e.g., bonding pads) which may be provided on the integrated circuit 120 and/or the MEMS die 110. The electrical contacts 141 may be embodied as pins, pads, bumps or balls among other known or future mounting structures. The functions and number of the electrical contacts 141 on the external-device interface depend on the protocol or protocols implemented and may include power, ground, data, and clock contacts among others. The external-device interface permits integration of the MEMS assembly 100 with a host device using reflow-soldering, fusion bonding, or other assembly processes.

As described herein, the electrically conductive layer 140 forms the surface-mounting interface including the electrical contacts 141, and may also form electrical leads and/or bonding pads. The electrically conductive layer 140 may be formed from copper or any other suitable conductive material (e.g., titanium, gold, platinum, etc.) The MEMS die 110 and the integrated circuit 120 may be electrically coupled to the electrically conductive layer 140, for example, to the electrical contacts 141 at predetermined locations via wire bonding, reflow-soldering, fusion bonding, etc. Typically, solder resist layers are used to provide a barrier for solder material, that is disposed on the substrate 103 (e.g., at locations where the MEMS die 110 and integrated circuit 120 are electrically coupled to the electrically conductive layer 140), to prevent the solder material from overflowing during bonding. Typically, MEMS dies and integrated circuits are disposed on the solder resist layer and attached thereto by a thin layer of adhesive (e.g., having a thickness of less than 15 microns). Such typical solder resist layers are also relatively hard and may have an elastic modulus of greater than 2,500 MPa. Thus, the typical hard solder resist layers and the thin adhesive layer provide little mechanical cushioning when the MEMS dies or the integrated circuits are disposed on and pressed onto the solder resist layer for bonding.

In contrast, the housing 102 includes a bond layer 160 disposed on the substrate 103 over the electrically conductive layer 140. The bond layer 160 has an elastic modulus of less than 10 MPa such that it provides a cushioning layer for bonding the MEMS die 110 and the integrated circuit 120 on the substrate 103 and reduce stress transfer to the MEMS die 110 and the integrated circuit 120 during the bonding process. In some embodiments, the bond layer 160 serves as a solder resist layer for the electrically conductive layer 140 and provides mechanical dampening when the MEMS die 110 or the integrated circuit 120 are pressed onto the bond layer 160 during the bonding process. Thus, the bond layer 160 reduces stress transfer and reduces or eliminates mechanical damage to the MEMS die 110 and the integrated circuit 120.

An opening 162 may be defined in the bond layer 160 circumferentially around the sound port 104. Other openings or throughholes may be defined in the bond layer 160 at locations where bonding pads of the electrically conductive layer 140 are located.

In some embodiments, the elastic modulus of the bond layer 160 may be in a range of about 0.5 MPa to about 5 MPa. In some embodiments, the elastic modulus of the bond layer 160 may be in a range of 1.5 MPa to 3 MPa. For example, the bond layer 160 may include polydimethylsiloxane (PDMS) that is three orders of magnitude softer than the hard substrate, or conventional solder resist layers that are typically used for insulating electrically conductive layers of substrates used in microphone assemblies.

In some embodiments, the bond layer 160 may have a thickness in a range of about 20 microns to about 50 microns (e.g., about 20, 25, 30, 35, 40, 45, or 50 microns, inclusive). In some embodiments, the bond layer 160 may have a uniform thickness across the area of the substrate 103. In other embodiments, the bond layer 160 may have areas of varying thickness across the area of the substrate 103. For example, the bond layer 160 may be thicker at locations where the MEMS die 110 and the integrated circuit 120 are located.

The bond layer 160 may be formed on the substrate 103 using any suitable method. In some embodiments, the bond layer 160 may be spun coat or spray coated on the substrate 103. In other embodiments, the bond layer 160 may be molded or cast on the substrate 103. In still other embodiments, the bond layer 160 may be formed separately and then bonded to the substrate 103 using any suitable process (e.g., using plasma bonding or via an adhesive). The MEMS die 110 is positioned over the bond layer 160 on the sound port 104, and is configured to generate an electrical signal responsive to an acoustic signal received through the sound port 104. In FIG. 1A, the MEMS die 110 and the integrated circuit 120 are shown disposed on a surface of the substrate 103, but in other embodiments one or more of these components may be disposed on the enclosure 130 (e.g., on an inner surface of the enclosure 130), on walls of the enclosure 130, or stacked atop one another. In such embodiments, a bond layer (e.g., the bond layer 160) may be disposed on the enclosure 130 and the MEMS die 110, and the integrated circuit 120 may be disposed on the bond layer.

In various embodiments, the MEMS die 110 may comprise one or a plurality of electrodes, for example, a first electrode 112 and a second electrode 114 disposed above the first electrode 112. In some embodiments in which the MEMS die 110 is an acoustic transducer, the first electrode 112 may include a diaphragm and the second electrode 114 may include a back plate. At least one of the electrodes, for example, the first electrode 112 (e.g., a diaphragm) is movable in response to changes in air pressure communicated via the sound port 104. The first electrode 112 and the second electrode 114 (e.g., a back plate) may be disposed on a die substrate 111. The first electrode 112 may have a thickness in a range of 0.1-10 microns. As shown in FIG. 1A, the first electrode 112 separates a front volume 105 defined between the first electrode 112 and the sound port 104 from the internal volume 107 that forms a back volume of the MEMS assembly 100 between the enclosure 130 and first electrode 112. Thus, the MEMS assembly 100 is a bottom port MEMS assembly (e.g., a bottom port microphone assembly) in which the sound port 104 is defined in the substrate 103 such that an internal volume 107 of the enclosure 130 defines the back volume. It should be appreciated that in other embodiments, the concepts described herein may be implemented in a top port MEMS assembly (e.g., a top port microphone assembly) in which a sound port is defined in the enclosure 130 of the MEMS assembly 100.

In some implementations, the MEMS die 110 may include a MEMS transducer embodied as a condenser-type transducer having the first electrode 112 movable relative to the second electrode 114 in response to changes in acoustic pressure. Alternatively, the MEMS die 110 may include a piezoelectric device, or some other known or future electroacoustic transduction device implemented using MEMS technology. In still other implementations, the MEMS die 110 is a non-MEMS device embodied, for example, as an electret or other known or future non-MEMS type transduction device.

In some embodiments, the MEMS die 110 may be formed from a dielectric and/or conductive material (e.g., silicon oxide, silicon nitride, silicon carbide, gold, aluminum, platinum, etc.). In some embodiments in which the MEMS die 110 is an acoustic transducer, movement of the first electrode 112 (e.g., a diaphragm) in response to an acoustic signal may generate an electrical signal (e.g., a voltage corresponding to a change in capacitance thereof), which may be measured and is representative of the acoustic signal. In some implementations, vibration of the first electrode 112 relative to the second electrode 114 (e.g., a fixed back plate) causes changes in the capacitance between the first electrode 112 and the second electrode 114 and corresponding changes in the generated electrical signal. In other embodiments, the MEMS die 110 may be formed from a piezoelectric material, for example, quartz, lead titanate, III-V and II-VI semiconductors (e.g., gallium nitride, indium nitride, aluminum nitride, zinc oxide, etc.), graphene, ultra nanocrystalline diamond, polymers (e.g., polyvinylidene fluoride) or any other suitable piezoelectric material. In such embodiments, vibration of the first electrode 112 in response to the acoustic signal may generate an electrical signal (e.g., a piezoelectric current or voltage) which is representative of the acoustic signal. In some embodiments, a pierce or through-hole is defined through the first electrode 112 to provide pressure equalization between the front and back volumes 105 and 107. In other embodiments, a vent may be defined in the enclosure 130 to allow pressure equalization.

The second electrode 114 (e.g., a back plate) is disposed above the first electrode 112 (e.g., a diaphragm) such that the second electrode 114 is spaced apart from the first electrode 112. A plurality of apertures 116 are defined in the second electrode 114. The second electrode 114 may be formed from polysilicon, silicon nitride, other suitable materials (e.g., silicon oxide, silicon, ceramics, etc.), or sandwiches thereof. Vibrations of the first electrode 112 relative to the second electrode 114 that is substantially fixed, (e.g., substantially inflexible relative to the first electrode 112) in response to acoustic signals received on the first electrode 112 causes changes in the capacitance between the first electrode 112 and the second electrode 114, and corresponding changes in the generated electrical signal. While the second electrode 114 is disposed above the first electrode 112 as shown in FIG. 1A, in other embodiments the second electrode 114 may be disposed below the first electrode 112, or the second electrode 114 may be disposed between a first and second electrode (e.g., interposed between diaphragms) each of which includes the first electrode 112, for example, in a dual diaphragm acoustic transducer, or any other MEMS die.

The integrated circuit 120 is positioned on the substrate 103. The integrated circuit 120 is electrically coupled to the MEMS die 110, for example, through the electrically conductive layer 140, i.e., is electrically coupled to the MEMS die 110 and the electrical contacts 141 of the housing 102. The integrated circuit 120 receives an electrical signal from the MEMS die 110 and may amplify and condition the signal before outputting a digital or analog electrical signal as is known generally. The integrated circuit 120 may also include a protocol interface (not shown), depending on the output protocol desired. The integrated circuit 120 may also be configured to permit programming or interrogation thereof as described herein. Exemplary protocols include but are not limited to PDM, PCM, SoundWire, I2C, I2S and SPI, among others.

The integrated circuit 120 may include one or more components, for example, a processor, a memory, and/or a communication interface. The processor may be implemented as one or more general-purpose processors, an application specific integrated circuit (ASIC), one or more field programmable gate arrays (FPGAs), a digital signal processor (DSP), a group of processing components, or other suitable electronic processing components. In other embodiments, the DSP may be separate from the integrated circuit 120 and in some implementations, may be stacked on the integrated circuit 120. In some embodiments, the one or more processors may be shared by multiple circuits and, may execute instructions stored, or otherwise accessed, via different areas of memory). Alternatively, or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. All such variations are intended to fall within the scope of the present disclosure. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on.

In some embodiments, the MEMS die 110 (e.g., the die substrate 111) and integrated circuit 120 may be directly bonded to the bond layer 160, for example, via plasma bonding (e.g., oxygen plasma bonding). In other embodiments, the MEMS die 110 and the integrated circuit 120 may be bonded to the bond layer 160 via an adhesive (e.g., a die attach adhesive). For example, the MEMS die 110 is bonded to the bond layer 160 via a first adhesive layer 172 and the integrated circuit 120 is bonded to the bond layer 160 via a second adhesive layer 174, as shown in FIG. 1A.

The enclosure 130 is positioned on the substrate 103. The enclosure 130 defines the internal volume 107 within which at least the integrated circuit 120 and the MEMS die 110 are positioned. For example, as shown in FIG. 1A, the enclosure 130 is positioned on the substrate 103 such that the substrate 103 forms a base of the MEMS assembly 100, and the substrate 103 and the enclosure 130 cooperatively define the internal volume 107. As previously described herein, the internal volume 107 defines the back volume of the MEMS assembly 100. The enclosure 130 may be formed from a suitable material such as, for example, metals (e.g., aluminum, copper, stainless steel, etc.), and is coupled to the substrate 103 at a bond 128. The bond 128 may include, for example, an adhesive, a solder or a fusion bond. An end 133 of a wall of the enclosure 130 contacts the substrate 103 and is coupled thereto by the bond 128.

Figure 1B:
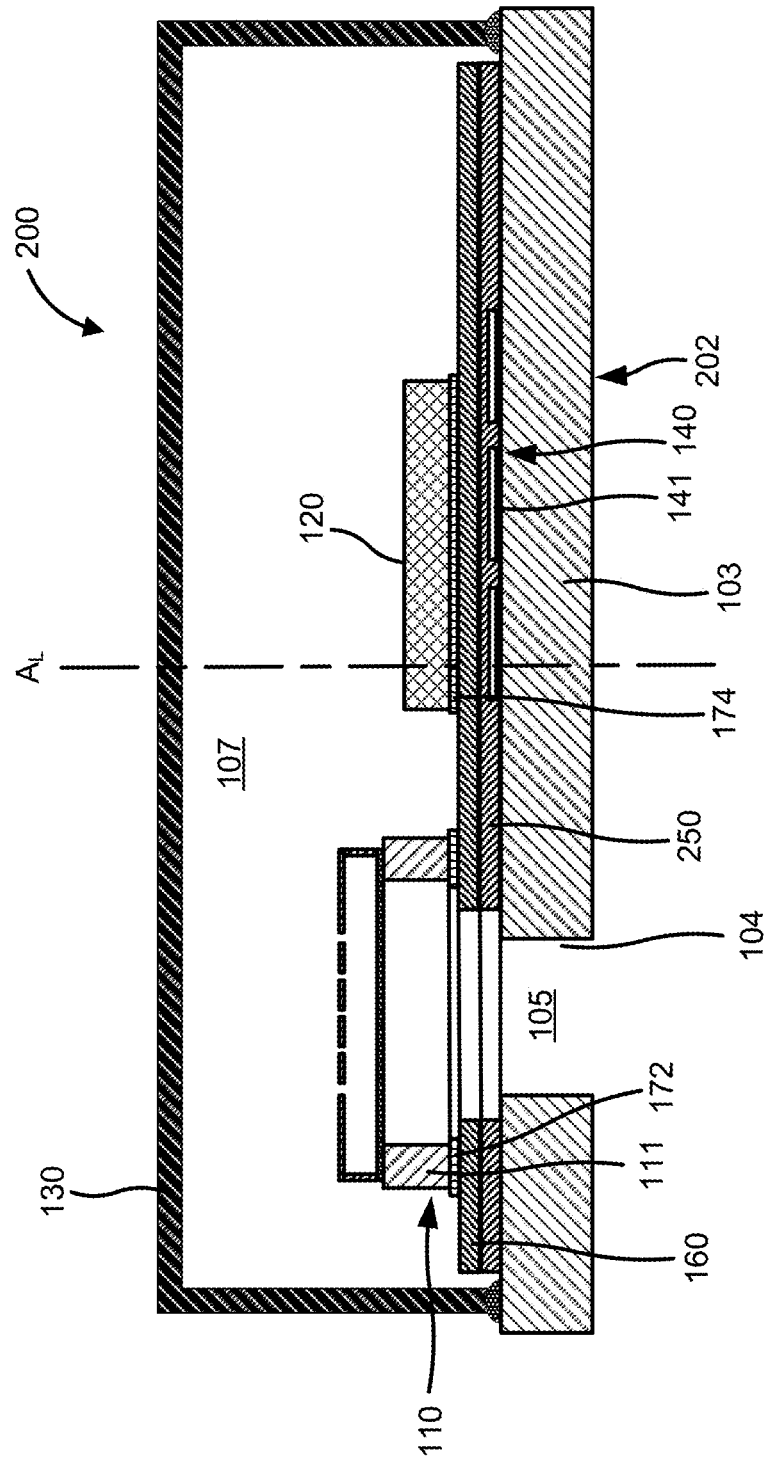
FIG. 1B is a side cross-section view of a MEMS assembly, according to another embodiment.

FIG. 1B is a side cross-section view of a MEMS assembly 200 (e.g., a microphone assembly), according to another embodiment. The MEMS assembly 200 is substantially similar to the MEMS assembly 100 and includes the same components as the MEMS assembly 100. However, different from the MEMS assembly 100, the MEMS assembly 200 includes a substrate assembly 202 including the substrate 103 and a solder resist layer 250 interposed between the electrically conductive layer 140 and the bond layer 160. The solder resist layer 250 may include an epoxy liquid that is screen printed on the substrate 103, a liquid photoimageable solder mask, or a dry-film photoimageable solder mask. The solder resist layer 250 may have a thickness in a range of about 10 microns to about 20 microns. The solder resist layer 250 may be relatively hard, having an elastic modulus of greater than 2,500 MPa. Because of the high elastic modulus of the solder resist layer 250, the solder resist layer 250 does not impede stress transfer to the MEMS die 110 or the integrated circuit 120 during the bonding process. Therefore, the bond layer 160 serves as an additional cushioning and dampening layer over the solder resist layer 250 to reduce stress transfer to the MEMS die 110 and the integrated circuit 120.

In some embodiments, the bond layer 160 may include a first portion and a second portion that are not in contact with one another. In such embodiments, the MEMS die 110 is disposed on the first portion, and the integrated circuit 120 is disposed on the second portion. In some embodiments, the MEMS die 110 and the integrated portion 120 are directly bonded to the first portion and the second portion, respectively.

Figure 2:
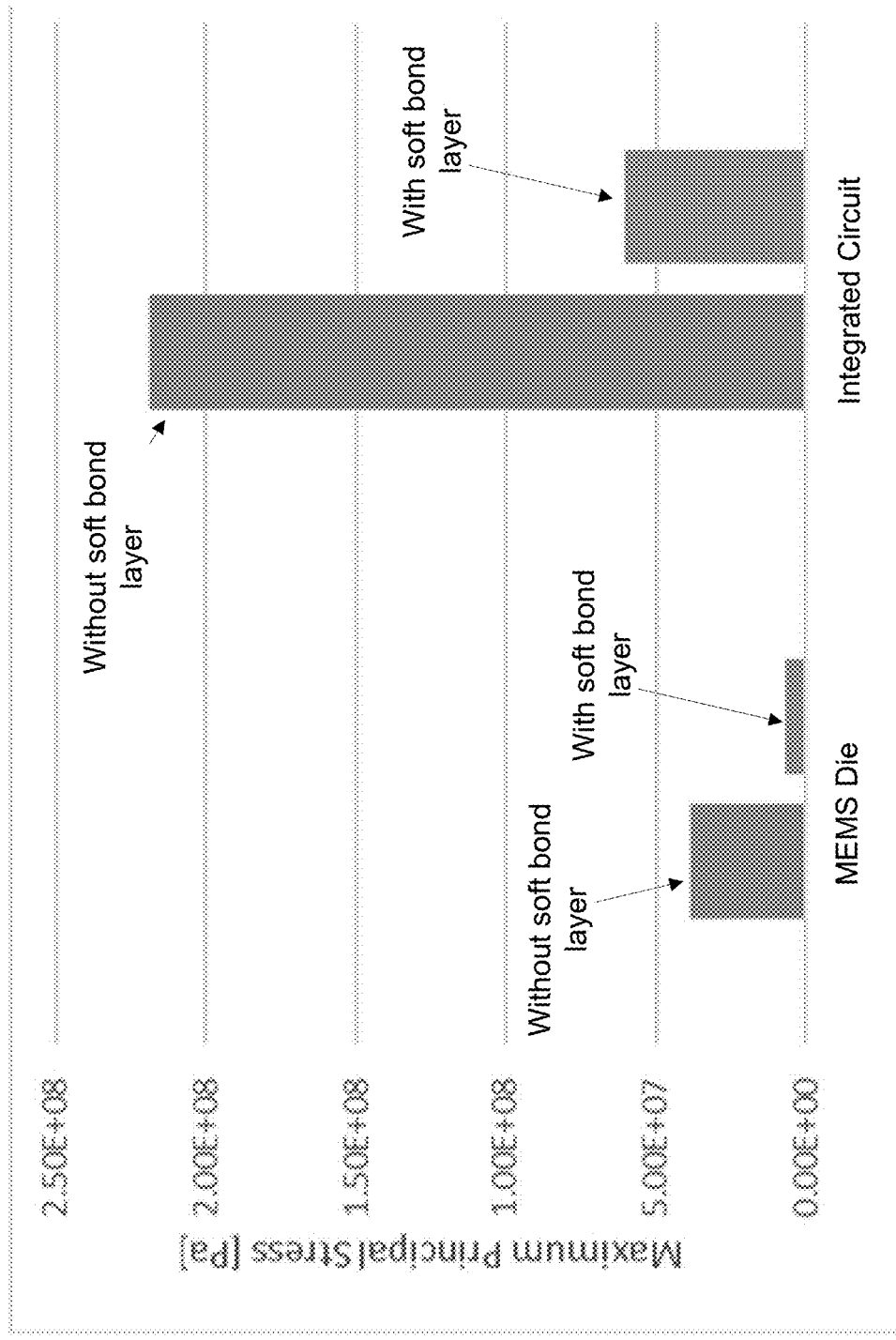
FIG. 2 is a bar chart showing maximum principal stress transmitted to a MEMS die and an integrated circuit bonded to a substrate with a bond layer disposed thereon, and without the bond layer disposed thereon.

FIG. 2 is a bar chart showing maximum principal stress experienced by a MEMS die and an integrated circuit bonded to a substrate with a bond layer disposed thereon, and without the bond layer disposed thereon. The bond layer includes a PDMS layer having a thickness of about 20 microns. A reduction in maximum principal stress of about 40 MPa is observed for the MEMS die, and reduction in maximum principal stress of about 160 MPa is observed for the integrated circuit with use of the bond layer.

Figure 3:
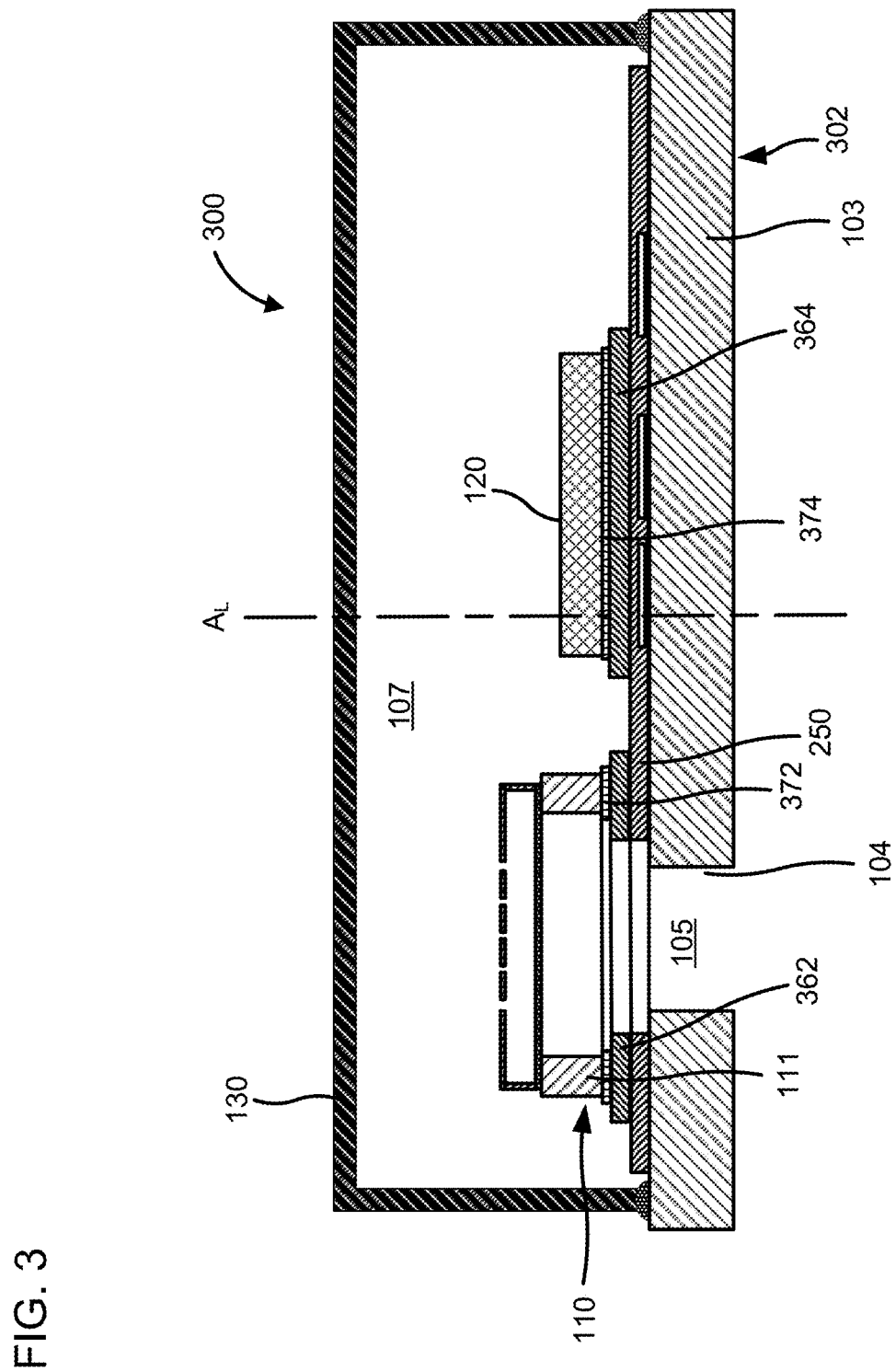
FIG. 3 is a side cross-section view of a MEMS assembly, according to an embodiment.

In some embodiments, MEMS die (e.g., acoustic transducers) and/or integrated circuits may be disposed on mounting pads formed from a bond material that are disposed on a solder resist layer of a substrate. For example, FIG. 3 is a side cross-section view of a MEMS assembly 300 (e.g., a microphone assembly), according to an embodiment. The MEMS assembly 300 includes a substrate assembly 302 including the substrate 103, the MEMS die 110 (e.g., an acoustic transducer), the integrated circuit 120, and the enclosure 130 disposed on the substrate 103, as previously described herein with the respect to the MEMS assembly 100, 200. The electrically conductive layer 140 is disposed on the substrate 103, and the solder resist layer 250 is disposed on the substrate 103 over the electrically conductive layer 140.

The MEMS assembly 300 includes a first portion 362 or first mounting pad 362 disposed on the substrate 103. For example, as shown in FIG. 3, the first mounting pad 362 is disposed on the solder resist layer 250 at a location where the MEMS die 110 is to be disposed. A second portion 364 or second mounting pad 364 is disposed on the solder resist layer 250 at a location where the integrated circuit 120 is to be disposed. In some embodiments, the solder resist layer 250 can be a hard layer having an elastic modulus of greater than 2,500 MPa. In some embodiments, the solder resist layer 250 may be formed from the bond material having an elastic modulus in a range of about 0.5 MPa to about 5 MPa (e.g., in a range of about 1.5 MPa to about 3 MPa).

The first mounting pad 362 and the second mounting pad 364 are formed from a bonding material having an elastic modulus of less than 500 MPa. In some embodiments, the elastic modulus of the bonding material is in a range of about 0.5 MPa to about 5 MPa (e.g., in a range of about 1.5 MPa to about 3 MPa). For example, the bonding material may include PDMS.

In some embodiments, the bonding material may have an elastic modulus in a range of about 0.5 MPa to about 300 MPa. In such embodiments, the bonding material may include a photoimageable silicone, i.e., a silicone material capable of being photo cross-linked into a desirable shape. For example, the photoimageable silicone may include the photoimageable silicone sold under the tradename WL-5150 by DOW CORNING®. In some embodiments, the first mounting pad 362 and the second mounting pad 364 may have a thickness in range of about 20 microns to 50 microns (e.g., 10, 20, 30, 40, or 50 microns, inclusive).

The MEMS die 110 is disposed on the first mounting pad 362 and bonded thereto, and the integrated circuit 120 is disposed on the second mounting pad 364 and bonded thereto. In some embodiments, the MEMS die 110 and the integrated circuit 120 are directly bonded to the first mounting pad 362 and the second mounting pad 364, respectively, for example, via oxygen plasma bonding. In other embodiments, the MEMS die 110 and the integrated circuit 120 are bonded to the first mounting pad 362 and the second mounting pad 364 via an adhesive. For example, a first adhesive layer 372 (e.g., a die attach adhesive) is used to bond the MEMS die 110 to the first mounting pad 362 and a second adhesive layer 374 is used to bond the integrated circuit 120 to the second mounting pad 364. In some embodiments, a thickness of the first and second adhesive layers 372, 374 may be less than 10 microns. In some embodiments, the first adhesive layer 372 and the second adhesive layer 374 may also comprises the bond material. For example, the first and second adhesive layers 372 and 374 may comprises a silicone (e.g., PDMS).

Figure 4A:
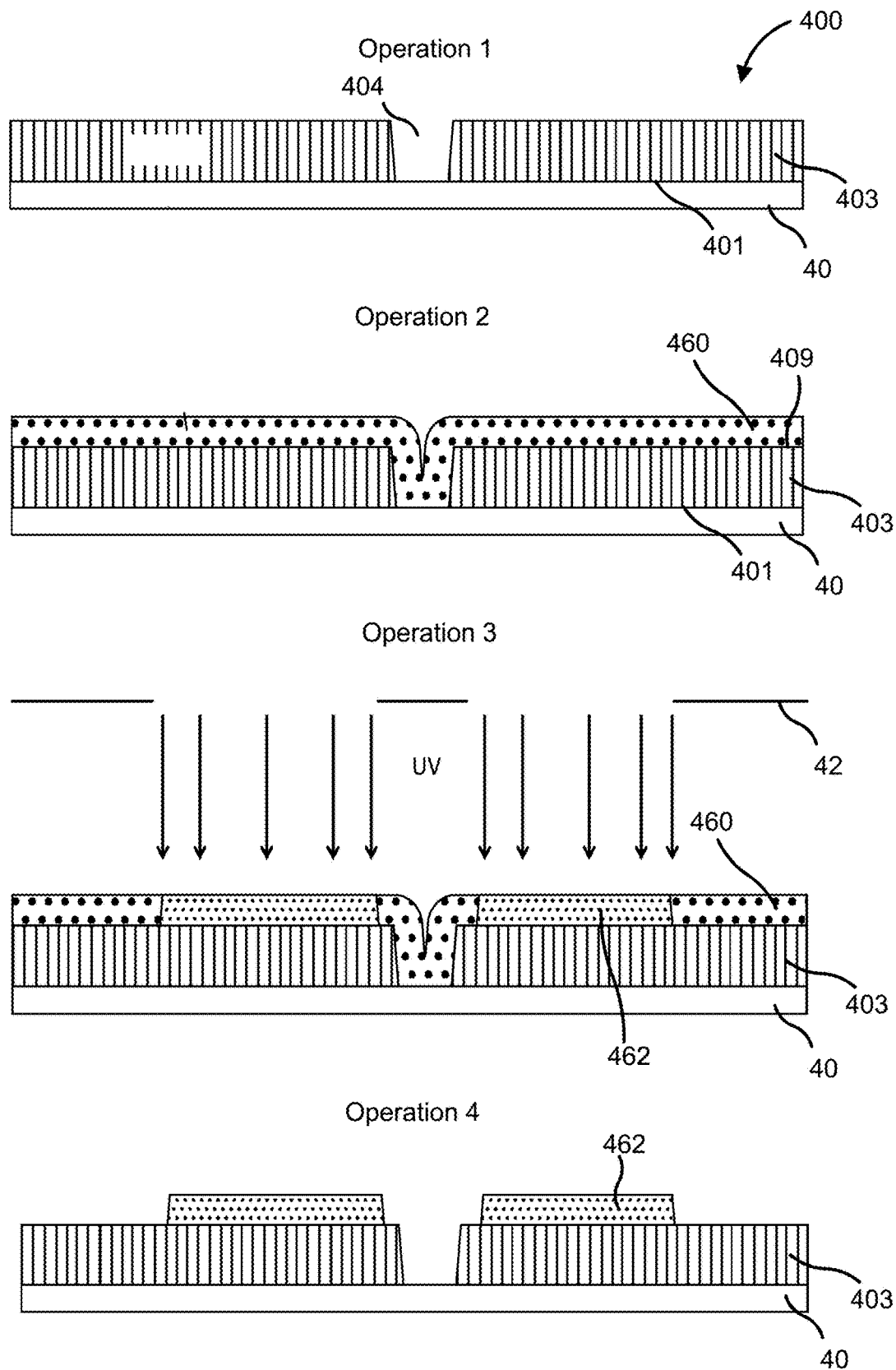
FIGS. 4A-4B illustrate various operations of an example process for forming a mounting pad on a substrate of a MEMS assembly, according to an embodiment.
Figure 4B:
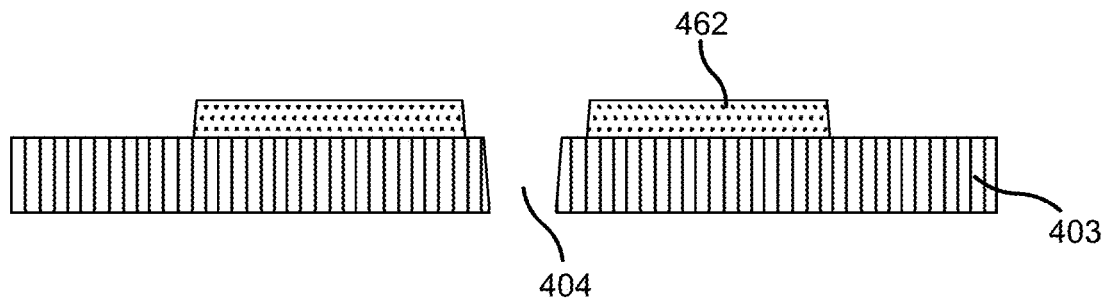
Figure 4B:
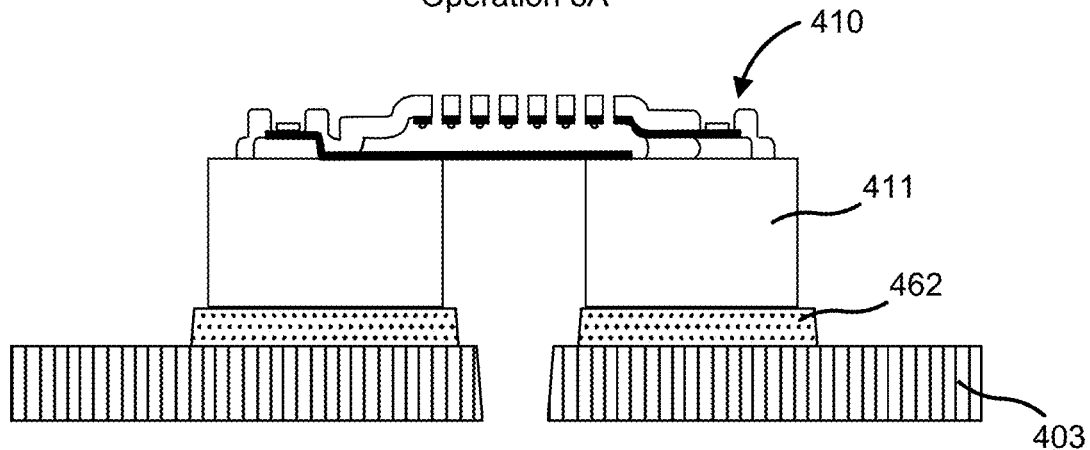
Figure 4B:
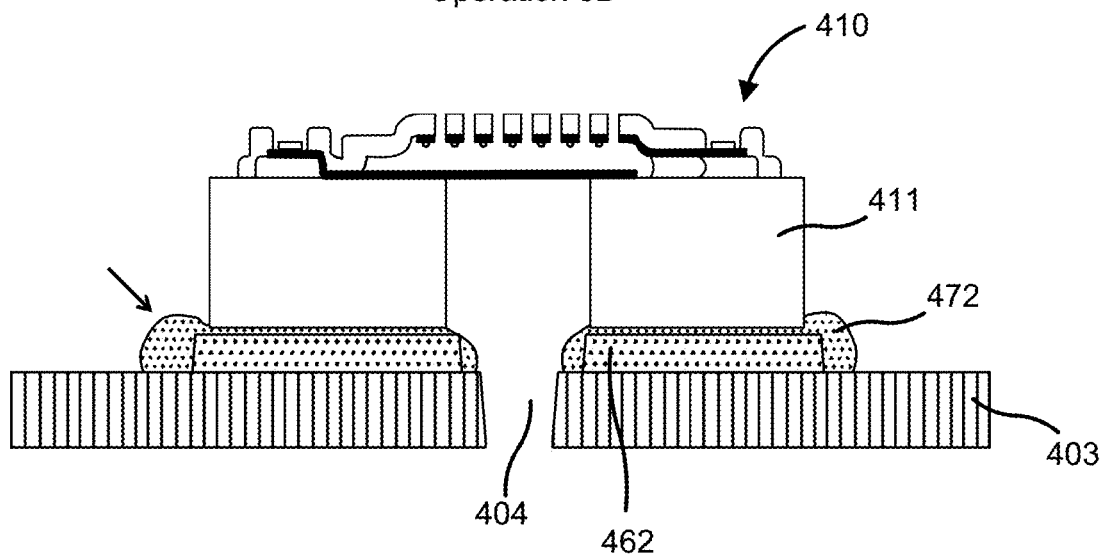

FIGS. 4A-4B illustrate various operations of an example process 400 for forming a mounting pad on a substrate of a MEMS assembly such as the MEMS assembly 300, according to an embodiment. The process 400 includes disposing a tape 40 on a substrate first surface 401 of a substrate 403 that defines a sound port 404, at operation 1. The tape 40 may include, for example, electrical tape. The substrate 403 may be substantially similar to the substrate 103 and includes an electrically conductive layer (not shown) and a solder resist layer (not shown), as described with respect to substrate 103.

At operation 2, a bond layer 460 is disposed (e.g., cast or spun coat) on a substrate second surface 409 that is opposite the substrate first surface 401. The bond layer 460 is formed from a bond material, for example, a photoimageable silicone (e.g., WL-5150) that cross-links when exposed to ultraviolet (UV) light. In some embodiments, the bond material may have an elastic modulus in a range of 0.5 MPa to 300 MPa. The bond layer 460 may be spin coated on the substrate 403 and may be prebaked at a predetermined temperature (e.g., in a range of about 80 degrees Celsius to about 300 degrees Celsius). The tape 40 serves as a barrier for preventing the bond layer 460 that is in liquid state to flow through the sound port 404.

At operation 3, the bond layer 460 is exposed to a light source, for example, a UV light thorough a photolithography mask 42 such that only selected portions of the bond layer 460 that correspond to locations where a MEMS die (e.g., an acoustic transducer, a pressure sensor, an accelerometer, etc.) is to be disposed, are exposed to the UV light. The UV light cross-links the selected portions of the bond layer 460 to form a solid mounting pad 462.

At operation 4, the uncross-linked portion of the bond layer 460 is removed (e.g., by developing in any suitable developer solution) such that the mounting pad 462 remains on the substrate 403. The mounting pad 462 may have a shape that corresponds to a shape of a die substrate 411 of the MEMS die 410 (e.g., a square, rectangular, or circular shape having a circular opening defined through the mounting pad 462). At operation 5, the tape 40 is removed from the substrate 403 (e.g., physically peeled off or chemically etched). In some embodiments, the mounting pad 462 may be post-baked at a predetermined temperature (e.g., in a range of about 80 degrees Celsius to about 300 degrees Celsius) so as to completely cure the bond material forming the mounting pad 462 such that the bond material does not have any inherent tackiness or adhesiveness after curing.

In some embodiments, the die substrate 411 of the MEMS die 410, for example, an acoustic transducer, is disposed on the mounting pad 462 and bonded directly to the mounting pad 462 via oxygen plasma bonding, at operation 6A. In such embodiments, the bond material from which the mounting pad 462 is formed is already completely cured before the MEMS die 410 is bonded directly thereto, i.e., oxygen plasma bonding merely activates the completely cured bond material for bonding the MEMS die 410 to the mounting pad 462. In other embodiments, the die substrate 411 may be bonded to the mounting pad 462 via an adhesive 472 (e.g., a die attach adhesive), at operation 6B.

Figure 5:
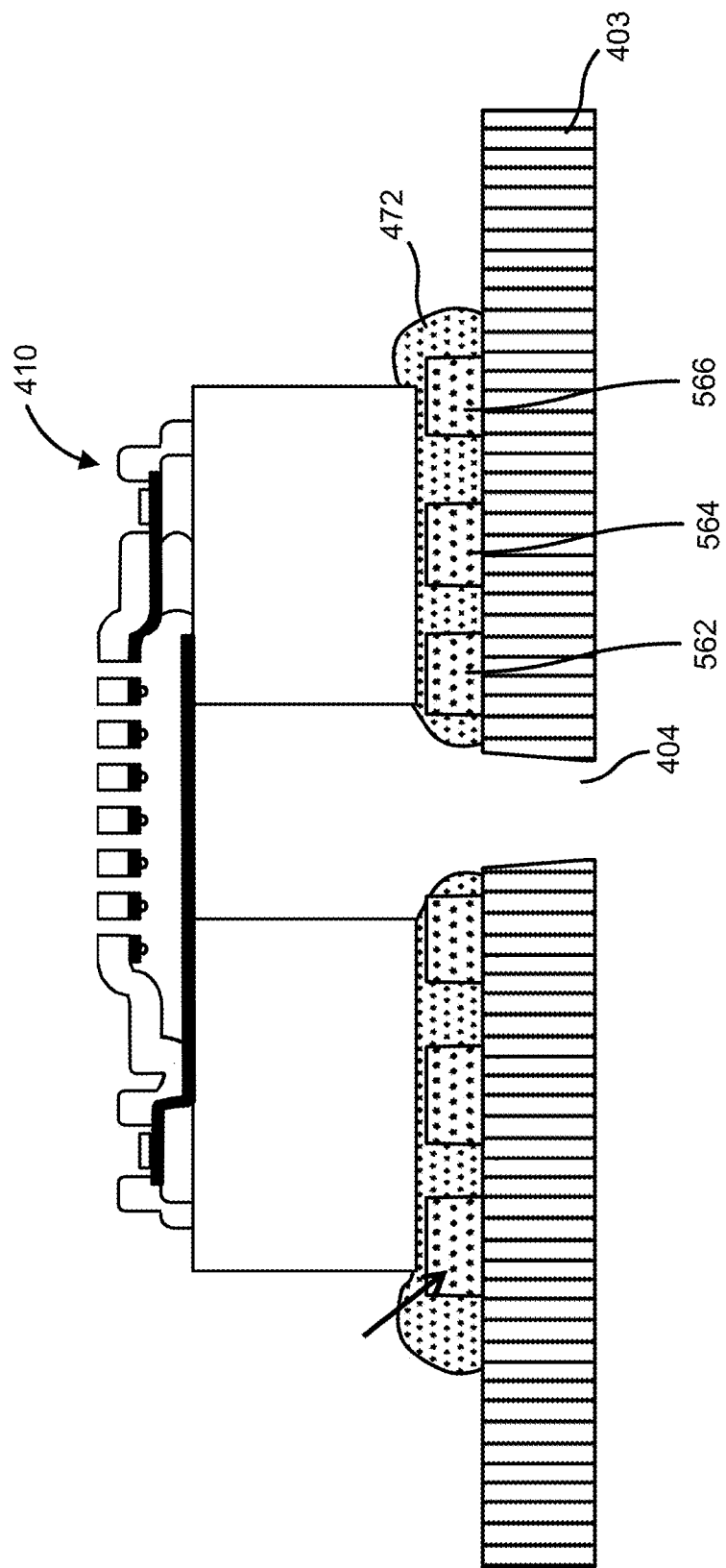
FIG. 5 is a side cross-section view a substrate for a MEMS assembly that includes a plurality of mounting pads disposed thereon, and a MEMS die disposed on the plurality of mounting pads, according to an embodiment.

In some embodiments, the patterning of the bond layer forms a plurality of portions of the bond layer, for example, a plurality of mounting pads that are not connected with each other. The plurality of mounting pads may be used to mount the MEMS die, for example, an acoustic transducer, or the integrated circuit to at least a subset of the plurality of portions of the bond layer. For example, as shown in FIG. 5, instead of the mounting pad 462, a set of mounting pads that include a first mounting pad 562, a second mounting pad 564, and a third mounting pad 566 are formed on the substrate 403. In some embodiments, the mounting pads 562, 564, and 566 may be concentric with each other. The die substrate 411 of the MEMS die 410 is disposed on and bonded to each of the mounting pads 562, 564, 566 via the adhesive 472. The adhesive 472 flows between the mounting pads 562, 564, 566 allowing the adhesive 472 to contact and bond to the substrate 403 as well as to sidewalls of the mounting pads 562, 564, 566. This increases the contact area of the adhesive 472 and causes the adhesive 472 to interlock with the mounting pads 562, 564, 566, thereby increasing mechanical strength and adhesion of the adhesive 472.

Figure 6A:
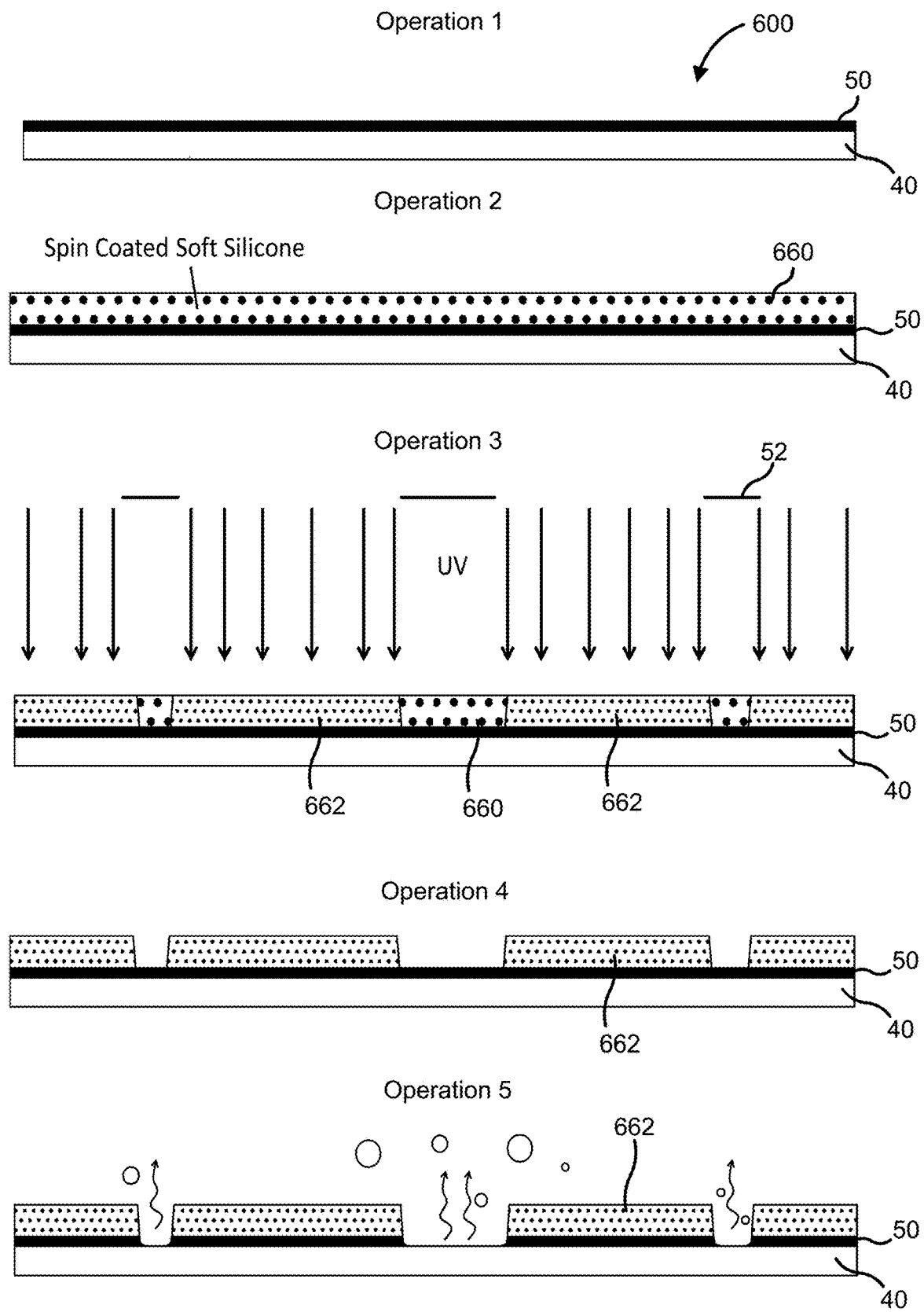
FIGS. 6A-6C illustrate various operations of an example process for forming a mounting pad on a substrate of a MEMS assembly, according to an embodiment.
Figure 6B:
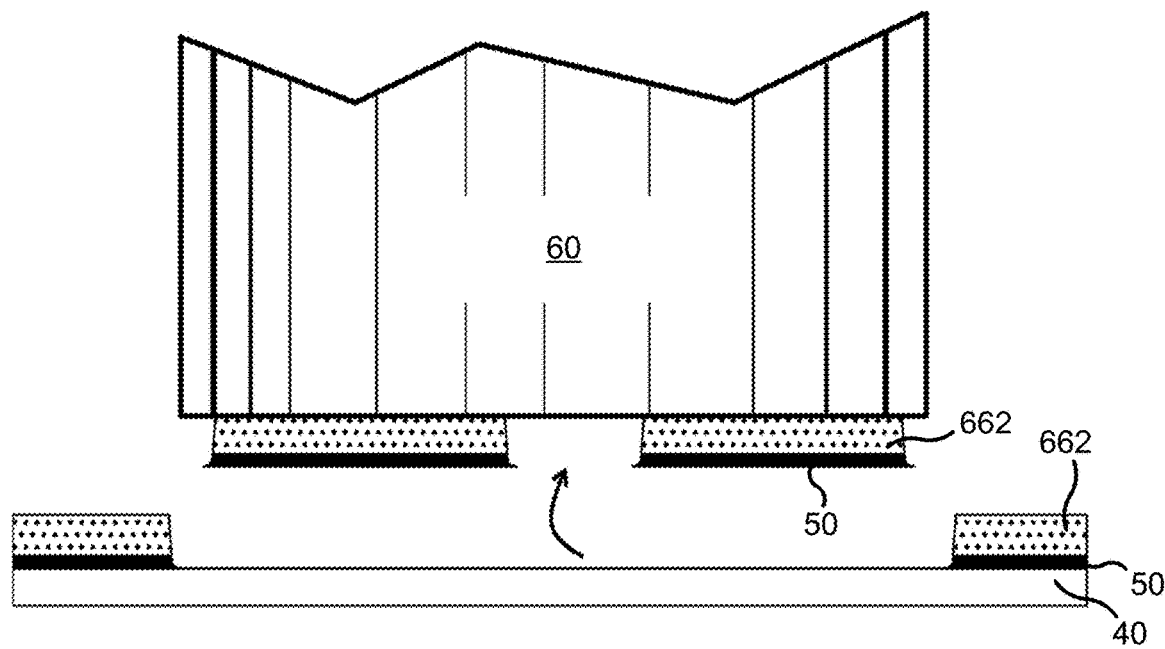
Figure 6B:
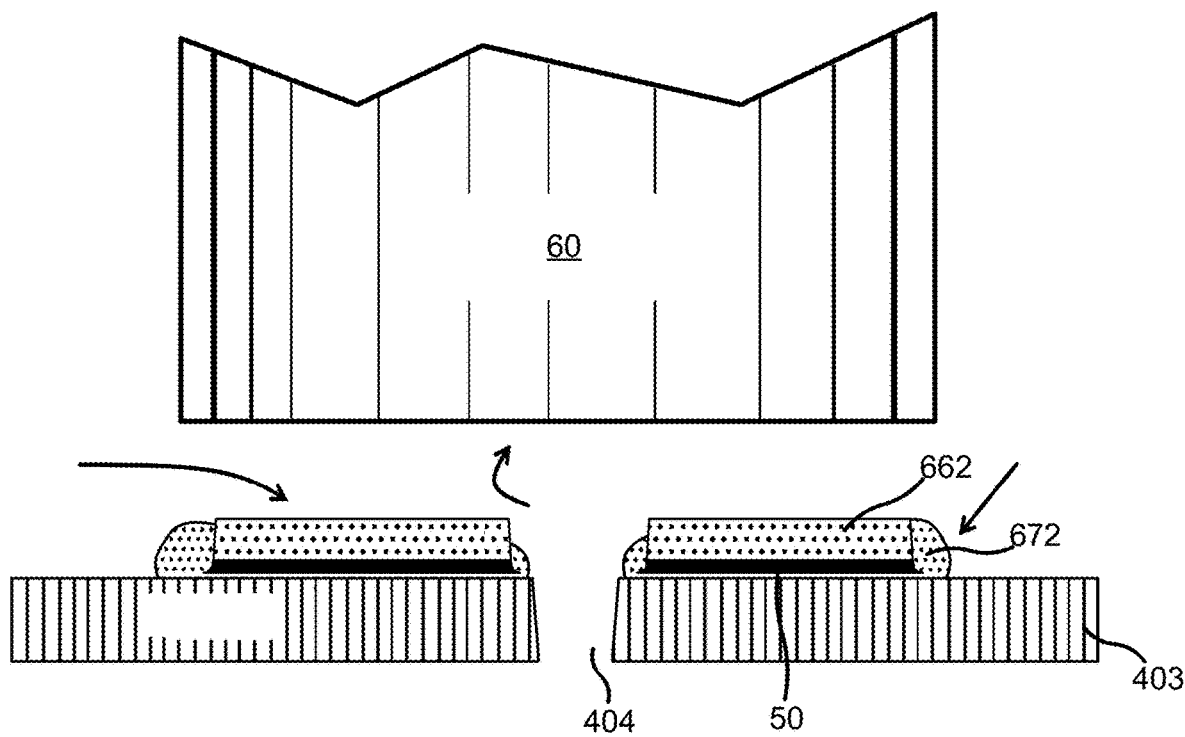
Figure 6C:
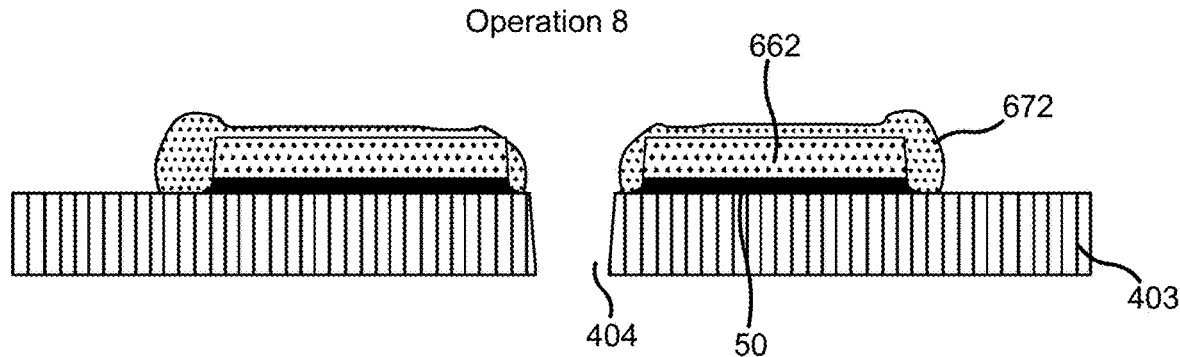
Figure 6C:
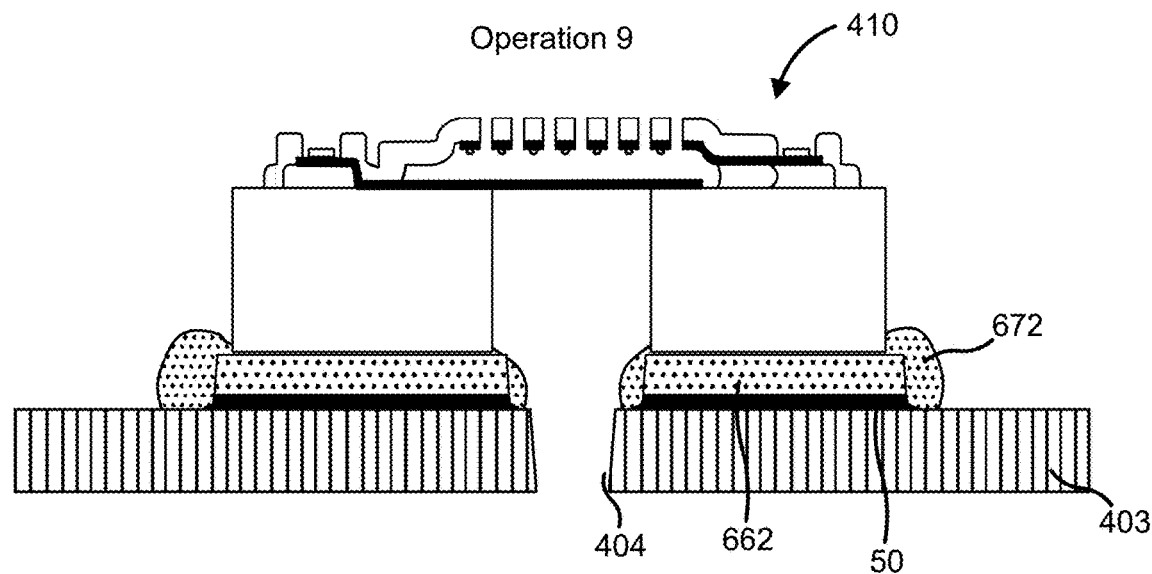

In some embodiments, mounting pads may be formed separately and then disposed on a substrate. For example, FIGS. 6A-6C illustrate various operations of an example process 600 for forming a mounting pad on a substrate of a MEMS assembly (e.g., a microphone assembly) such as the MEMS assembly 300, according to an embodiment.

The process 600 includes disposing a support layer 50 on the tape 40, at operation 1. In some embodiments, the support layer 50 may include a thin metal foil, a silicon wafer, or formed from any other etchable material. A thickness of the support layer 50 may be in a range of about 10 microns to about 100 microns, inclusive.

At operation 2, a bond layer 660 (e.g., WL-5150) is disposed on the support layer 50. In some embodiments, the bond layer 660 may be spin coated on the substrate 403 and may be prebaked at a predetermined temperature (e.g., in a range of about 80 degrees Celsius to about 300 degrees Celsius).

At operation 3, the bond layer 660 is exposed to a light source, for example, UV light thorough a photolithography mask 52 such that only selected portions of the bond layer 660 are exposed to the UV light. The UV light cross-links the selected portions of the bond layer 660 to form a plurality of portions, for example, a plurality of mounting pads 662.

At operation 4, the uncross-linked portions of the bond layer 660 are removed (e.g., by developing in any suitable developer solution) such that the plurality of mounting pads 662 remain on the support layer 50. In some embodiments, the plurality mounting pads 662 may be post-baked at a predetermined temperature (e.g., in a range of about 80 degrees Celsius to about 300 degrees Celsius) so as to completely cure the bond material forming the plurality of mounting pads 662 such that the bond material does not have any inherent tackiness or adhesiveness after curing. Each of the plurality of mounting pad 662 may have a shape that corresponds to a shape of the die substrate 411 of the MEMS die 410.

At operation 5, portions of the support layer 50 located between the plurality of mounting pads 662 are removed, for example, via wet etching with an acid, or dry etching. The bond material (e.g., the photoimageable silicone) is formulated to resist the etchant used to etch the portions of the support layer 50.

At operation 6, the plurality of mounting pads 662 (e.g., shaped as mounting rings) are rinsed (e.g., using a solvent such as acetone, methanol, ethanol, isopropyl alcohol, or a combination thereof or water), and picked up from the tape 40 with the corresponding unetched portion of the support layer 50 still attached to plurality of mounting pads 662 via a pickup tool 60. In various embodiments, the pickup tool 60 may include a flat tipped probe having one or more openings (not shown) that allow a negative pressure or suction to be selectively applied at a tip of the pickup tool 60 that contacts the mounting pads 662. The pickup tool 60 may selectively use suction to grip one or more of the plurality of mounting pads 662 and remove it from the tape 40.

At operation 7, the pickup tool 60 is used to position the removed mounting pad 662 on the substrate 403 at a predetermined location, for example, a location where the MEMS die 410 is configured to be disposed. An adhesive 672 is disposed on the substrate 403 and the mounting pad 662 is bonded to the substrate 403 via the adhesive 672. In some embodiments, the mounting pad 662 and adhesive 672 may be post-baked at a predetermined temperature (e.g., in a range of about 80 degrees Celsius to about 300 degrees Celsius).

In some embodiments, the MEMS die 410 may be bonded directly to the mounting pad 662, for example, via oxygen plasma bonding. The bond material from which the mounting pad 662 is formed is completely cured before the MEMS die 410 is bonded directly thereto such that the bond material does not have any inherent tackiness or adhesiveness after curing. The oxygen plasma bonding merely activates the bond material for bonding the MEMS die 410 to the mounting pad 662. In other embodiments, additional adhesive 672 may be disposed on the mounting pad 662, at operation 8. At operation 9, the MEMS die 410 is disposed on and bonded to the mounting pad 662 via the adhesive 672.

Figure 7:
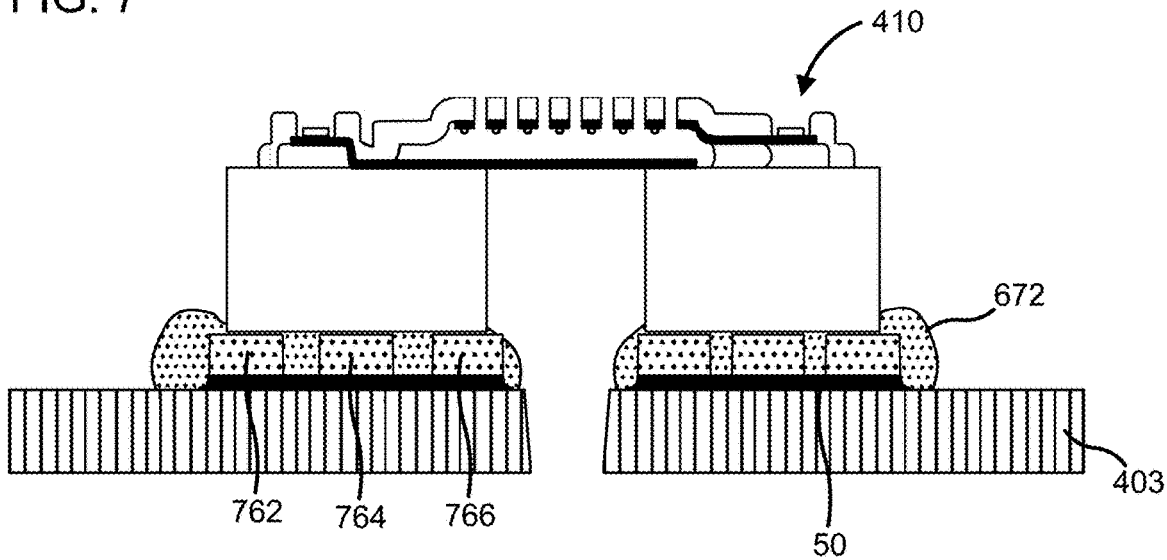
FIG. 7 is a side cross-section view a substrate for a MEMS assembly that includes a plurality of mounting pads disposed thereon, and a MEMS die disposed on the plurality of mounting pads, according to an embodiment.

In some embodiments, a plurality of portions, for example, a plurality of mounting pads may be disposed on the substrate 403. For example, as shown in FIG. 7, instead of the mounting pad 662, a set of mounting pads that include a first mounting pad 762, a second mounting pad 764, and a third mounting pad 766 are formed using the process 600 and bonded to the substrate 403 via the adhesive 672. In some embodiments, the mounting pads 762, 764, and 766 may be concentric with each other. The die substrate 411 of the MEMS die 410 is disposed on and bonded to each of the mounting pads 762, 764, 766 via the adhesive 672. The adhesive 672 flows between the mounting pads 762, 764, 766 allowing the adhesive 672 to contact and bond to the substrate 403 as well as to sidewall of the mounting pads 762, 764, 766, thereby interlocking with the mounting pads 762, 764, 766, thereby increasing mechanical strength and adhesion of the adhesive 672.

In some embodiments, a MEMS assembly includes a substrate, an electrically conductive layer disposed on the substrate, a bond layer disposed on the substrate over the electrically conductive layer, the bond layer having an elastic modulus of less than 500 MPa, and a MEMS die disposed on the bond layer.

In some embodiments, the elastic modulus of the bond layer is in a range of about 0.5 MPa to about 5 MPa. In some embodiments, the bond layer includes PDMS. In some embodiments, the MEMS die is directly in contact with the bond layer. In some embodiments, the MEMS die is coupled to the bond layer via an adhesive. In some embodiments, the MEMS assembly further includes a solder resist layer disposed on the electrically conductive layer, wherein the bond layer is disposed on the solder resist layer. In some embodiments, the bond layer has a thickness in a range of about 20 microns to about 50 microns.

In some embodiments, the MEMS die includes a plurality of electrodes. In some such embodiments, the MEMS assembly further includes: a housing having a sound port, wherein the substrate is part of the housing and the electrically conductive layer forms a surface-mounting interface comprising electrical contacts, and wherein at least one of the electrodes is movable in response to changes in air pressure communicated via the sound port; and an integrated circuit disposed in the housing and electrically coupled to the MEMS die and to electrical contacts of the housing.

In some embodiments, the integrated circuit is mounted to the bond layer. In some embodiments, the MEMS die includes an acoustic transducer configured to generate an electrical signal in response to an acoustic signal. In some embodiments, the MEMS assembly further includes an enclosure disposed on the substrate, wherein the MEMS die is disposed within the enclosure.

In some embodiments, the MEMS assembly further comprises an integrated circuit. In some embodiments, the bond layer includes a first portion and a second portion that are not in contact with one another, the MEMS die is disposed on the first portion, and the integrated circuit is disposed on the second portion. In some embodiments, the MEMS die and the integrated circuit are bonded directly to the first portion and the second portion, respectively. In some embodiments, the MEMS die and the integrated circuit are coupled to the first portion and the second portion, respectively, via an adhesive.

In some embodiments, the MEMS assembly further includes a solder resist layer disposed on the electrically conductive layer. The solder resist layer includes a first portion and a second portion that are not in contact with one another, and the first portion of the bond layer is disposed on the first portion of the solder resist layer and the second portion of the bond layer is disposed on the second portion of the solder resist layer.

In some embodiments, the elastic modulus of the bond layer is in a range of about 0.5 MPa to about 300 MPa. In some embodiments, the bond layer includes photoimageable silicone.

In some embodiments, a method of forming a MEMS assembly includes providing a substrate having an electrically conductive layer disposed thereon, depositing, on the substrate over the electrically conductive layer, a bonding material having an elastic modulus of less than 500 MPa so as to form a bond layer, completely curing the bond layer, and attaching a MEMS die to the completely cured bond layer.

In some embodiments, completely curing the bond layer comprises baking the bond layer at a temperature in a range of 80 degrees Celsius to 300 degrees Celsius. In some embodiments, the elastic modulus of the bonding material is in a range of about 0.5 MPa to about 5 MPa. In some embodiments, the bond layer has a thickness in a range of about 20 microns to about 50 microns. In some embodiments, the bond layer has a uniform thickness across the substrate. In some embodiments, the bond layer has a first thickness at areas of the bond layer where at least the MEMS die is located, which is larger than a second thickness of the bond layer at areas where at least the MEMS die is not located. In some embodiments, the bonding material is deposited via a spin coating or a spray coating process.

In some embodiments, the bonding material includes PDMS. In some embodiments, the attaching of the MEMS die to the bonding layer includes exposing the bond layer and the MEMS die to an oxygen plasma and directly bonding the MEMS die to the bond layer. In some embodiments, the attaching of the MEMS die to the bond layer includes attaching the MEMS die to the bond layer via an adhesive.

In some embodiments, the method further includes, prior to depositing the bonding material on the substrate, depositing a solder resist layer on the substrate over the electrically conductive layer, where the depositing the bonding material includes depositing the bonding material on the solder resist layer.

In some embodiments, the solder resist layer has a thickness in a range of about 10 microns to about 20 microns. In some embodiments, the solder layer has an elastic modulus of greater than 2,500 MPa. In some embodiments, the solder resist layer has an elastic modulus in a range of about 0.5 MPa to 5 MPa.

In some embodiments, the method further includes patterning the bond layer to form a first portion and a second portion that are not in contact with one another, where attaching the MEMS die to the bond layer includes attaching the MEMS die to at least one of the first portion of the bond layer or the second portion of the bond layer.

In some embodiments, the MEMS die includes an acoustic transducer, the attaching the MEMS die to bond layer includes attaching the MEMS die to the first portion of the bond layer, and the method further includes attaching an integrated circuit to the second portion of the bond layer.

In some embodiments, the bonding material includes a photoimageable silicone, and the patterning the bond layer includes exposing a portion of the bond layer to a light source to form the first portion and the second portion, and removing unexposed portions of the bond layer.

In some embodiments, the elastic modulus of the bond layer is in a range of about 0.5 MPa to about 300 MPa. In some embodiments, the patterning of the bond layer forms a plurality of portions of the bond layer that are not connected with each other; and the attaching of the MEMS die comprises attaching the MEMS die to at least a subset of the plurality of portions of the bond layer. In some embodiments, the plurality of portions of the bond layer are ring shaped and are concentric with each other.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:
1. A method of forming a micro electro mechanical system (MEMS) assembly, the method comprising:
    providing a substrate having an electrically conductive layer disposed thereon;

depositing, on the substrate over the electrically conductive layer, a bonding material having an elastic modulus of less than 500 MPa so as to form a bond layer;
completely curing the bond layer; and
attaching a MEMS die to the completely cured bond layer.

2. The method of claim 1, wherein completely curing the bond layer comprises baking the bond layer at a temperature in a range of 80 degrees Celsius to 300 degrees Celsius.

3. The method of claim 1, wherein the elastic modulus of the bonding material is in a range of about 0.5 MPa to about 5 MPa.

4. The method of claim 1, wherein the bond layer has a thickness in a range of about 20 microns to about 50 microns.

5. The method of claim 4, wherein the bond layer has a uniform thickness across the substrate.

6. The method of claim 4, wherein the bond layer has a first thickness at areas of the bond layer where at least the MEMS die is located, which is larger than a second thickness of the bond layer at areas where at least the MEMS die is not located.

7. The method of claim 1, wherein the bonding material is deposited via a spin coating or a spray coating process.

8. The method of claim 7, wherein the bonding material comprises polydimethylsiloxane (PDMS).

9. The method of claim 1, wherein the attaching of the MEMS die to the bonding layer comprises:
exposing the completely cured bond layer and the MEMS die to an oxygen plasma; and
directly bonding the MEMS die to the bond layer.

10. The method of claim 1, wherein the attaching of the MEMS die to the bond layer comprises attaching the MEMS die to the bond layer via an adhesive.

11. The method of claim 1, further comprising:
prior to depositing the bonding material on the substrate, depositing a solder resist layer on the substrate over the electrically conductive layer,
wherein the depositing the bonding material comprises depositing the bonding material on the solder resist layer.

12. The method of claim 11, wherein the solder resist layer has a thickness in a range of about 10 microns to about 20 microns.

13. The method of claim 12, wherein the solder layer has an elastic modulus of greater than 2,500 MPa.

14. The method of claim 12, wherein the solder resist layer has an elastic modulus in a range of about 0.5 MPa to 5 MPa.

15. The method of claim 1, further comprising:
patterning the bond layer to form a first portion and a second portion that are not in contact with one another,
wherein attaching the MEMS die to the bond layer comprises attaching the MEMS die to at least one of the first portion of the bond layer or the second portion of the bond layer.

16. The method of claim 15, wherein:
the MEMS die comprises an acoustic transducer, and the attaching the MEMS die to bond layer comprises attaching the MEMS die to the first portion of the bond layer; and
the method further comprises:
attaching an integrated circuit to the second portion of the bond layer.

17. The method of claim 15, wherein:
the bonding material comprises a photoimageable silicone; and
the patterning the bond layer comprises:
exposing a portion of the bond layer to a light source to form the first portion and the second portion, and
removing unexposed portions of the bond layer.

18. The method of claim 17, wherein the elastic modulus of the bond layer is in a range of about 0.5 MPa to about 300 MPa.

19. The method of claim 17, wherein:
the patterning of the bond layer forms a plurality of portions of the bond layer that are not connected with each other; and
the attaching of the MEMS die comprises attaching the MEMS die to at least a subset of the plurality of portions of the bond layer.

20. The method of claim 19, wherein the plurality of portions of the bond layer are ring shaped and are concentric with each other.

* * * * *